United States Patent
Wu et al.

(10) Patent No.: US 10,692,807 B2
(45) Date of Patent: Jun. 23, 2020

(54) CHIP-ON-FILM PACKAGE STRUCTURE AND DISPLAY DEVICE

(71) Applicant: Au Optronics Corporation, Hsinchu (TW)

(72) Inventors: Chang-Hui Wu, Hsinchu (TW); Yu-Huei Jiang, Hsinchu (TW); Hsiao-Chung Cheng, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/285,231

(22) Filed: Feb. 26, 2019

(65) Prior Publication Data
US 2020/0152553 A1    May 14, 2020

(30) Foreign Application Priority Data
Nov. 8, 2018 (TW) .............................. 107139728 A

(51) Int. Cl.
*H05K 1/00* (2006.01)
*H01L 23/498* (2006.01)
*H01L 23/00* (2006.01)

(52) U.S. Cl.
CPC .... *H01L 23/4985* (2013.01); *H01L 23/49838* (2013.01); *H01L 24/50* (2013.01)

(58) Field of Classification Search
None
See application file for complete search history.

(56) References Cited

U.S. PATENT DOCUMENTS

| 7,091,620 B2* | 8/2006 | Miyazaki | ............ H01L 23/3114 257/778 |
| 2012/0217556 A1* | 8/2012 | Kajiwara | ................ H01L 24/11 257/288 |

FOREIGN PATENT DOCUMENTS

| JP | 2000242194 | 9/2000 |
| JP | 2006013421 | 1/2006 |

\* cited by examiner

*Primary Examiner* — Andargie M Aychillhum
(74) *Attorney, Agent, or Firm* — JCIPRNET

(57) ABSTRACT

A chip-on-film (COF) package structure includes a first COF and a second COF. The first COF includes a first flexible substrate having a first external terminal and a first internal terminal opposite to each other, first outer leads disposed at the first external terminal, first inner leads disposed at the first internal terminal, and a first chip disposed between the first external terminal and the first internal terminal. The second COF includes a second flexible substrate having a second external terminal and a second internal terminal opposite to each other, second outer leads disposed at the second external terminal, second inner leads disposed at the second internal terminal, and a second chip disposed between the second external terminal and the second internal terminal. The first COF is partially overlapped with the second COF. A display device having the COF package structure is also provided.

20 Claims, 5 Drawing Sheets

CHIP-ON-FILM PACKAGE STRUCTURE AND DISPLAY DEVICE

CROSS-REFERENCE TO RELATED APPLICATION

This application claims the priority benefit of Taiwan application serial no. 107139728, filed on Nov. 8, 2018. The entirety of the above-mentioned patent application is hereby incorporated by reference herein and made a part of this specification.

BACKGROUND

Technical Field

The disclosure relates to a package structure and a display device; more particularly, the disclosure relates to a chip-on-film (COF) package structure having a plurality of rows of leads and a display device including the COF structure.

Description of Related Art

On the basis of high contrast, high brightness, high color saturation, and wide viewing angle of the conventional flat panel displays, the flat panel displays featuring ultra-high definition (UHD) have been rapidly emerging. On the premise that the image quality of the flat panel display is required to be improved to the UHD level, the number of chip-on-film (COF) packages located around the flat panel display and used to connect the flat panel display to the driving circuit is bound to increase, so that the pitch of two adjacent COF packages is reduced. If the distance between two adjacent COF packages is too small, which exceeds the process capability of the existing production apparatus, the bonding yield of the COF package and the flat panel display is significantly reduced, productivity is lowered, and the requirement for higher resolution and better image quality cannot be satisfied. Besides, the increase in the number of leads on the COF package also leads to the excessively small pitch between the leads, thus failing to comply with the manufacturing requirements of the production apparatus, lowering the productivity, and increasing manufacturing costs.

SUMMARY

The disclosure provides a chip-on-film (COF) package structure capable of ensuring good bonding yield and lowering manufacturing costs.

The disclosure provides a display device capable of ensuring good bonding yield and productivity, complying with the requirements for higher resolution and better image quality, and improving display quality.

According to an embodiment provided in the disclosure, a COF package structure includes a first COF and a second COF. The first COF includes a first flexible substrate having a first external terminal and a first internal terminal opposite to each other, a plurality of first outer leads disposed at the first external terminal, a plurality of first inner leads disposed at the first internal terminal, and a first chip disposed between the first external terminal and the first internal terminal. The second COF includes a second flexible substrate having a second external terminal and a second internal terminal opposite to each other, a plurality of second outer leads disposed at the second external terminal, a plurality of second inner leads disposed at the second internal terminal, and a second chip disposed between the second external terminal and the second internal terminal. The first COF is partially overlapped with the second COF. The first external terminal and the second external terminal are disposed at two opposite sides of a normal line, and the first internal terminal and the second internal terminal are at least partially overlapped.

According to an embodiment provided in the disclosure, a display device includes a display panel, a circuit board, and a plurality of the aforementioned COF package structures. The display panel is electrically connected to the first inner leads and the second inner leads of the COF package structures. The circuit board is electrically connected to the first outer leads and the second outer leads of the COF package structures. A distance is between any two adjacent COF package structures. The distance is from 0.1 mm to 4 mm.

In view of the above, in the COF package structure and the display device provided in one or more embodiments, the first COF and the second COF in the COF package structure can be easily overlapped and bonded; therefore, the number of inner leads in the COF package structure can be increased while the production costs can be significantly reduced, so as to ensure the good bonding yield and electrical quality. Additionally, since the number of the inner leads can be increased, the number of the COF package structures required by the display device can be decreased, so as to increase the distance between the adjacent COF package structures. As such, during a bonding process, the distance between the adjacent COF package structures can comply with the requirement of the production apparatus, so as to ensure good bonding yield and productivity, comply with the requirement for higher resolution and image quality, and improve the display quality of the display device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
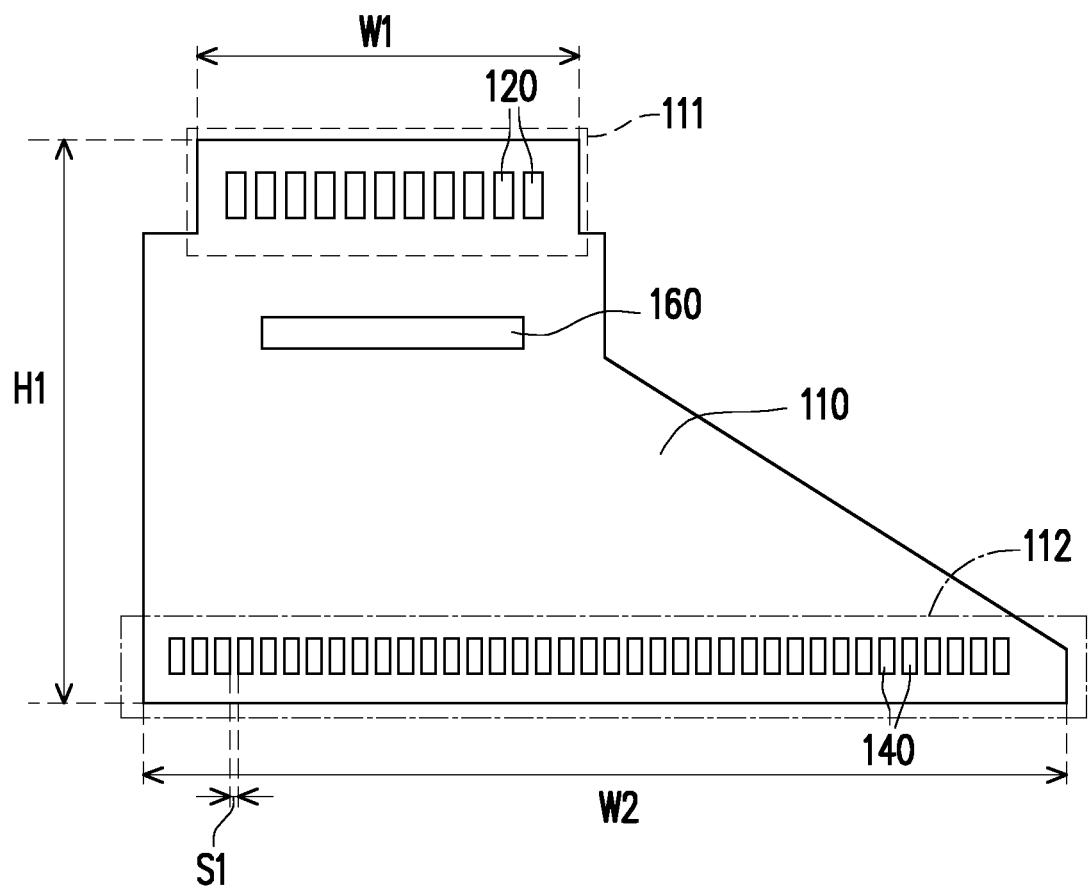
FIG. 1A is a schematic top view of a first chip-on-film (COF) according to an embodiment of the disclosure.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there is no intervening element present. As used herein, the term "connected" may refer to physically connected and/or electrically connected. Besides, "electrical connection" or "coupling" may be referred to as an intervening element existing between two elements.

It should be known that the terms "first," "second," "third," and the like are applied in the disclosure to describe each of the elements, parts, regions, layers and/or portions, but such terms should not limit the elements, parts, regions, layers and/or portions. These terms are only used to distinguish one element, part, region, layer, or portion from another. Hence, "the first element," "the first part," "the first region," "the first layer," or "the first portion" may also be called as "the second element," "the second part," "the second region," "the second layer," or "the second portion" without departing from the teachings provided herein.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1B:
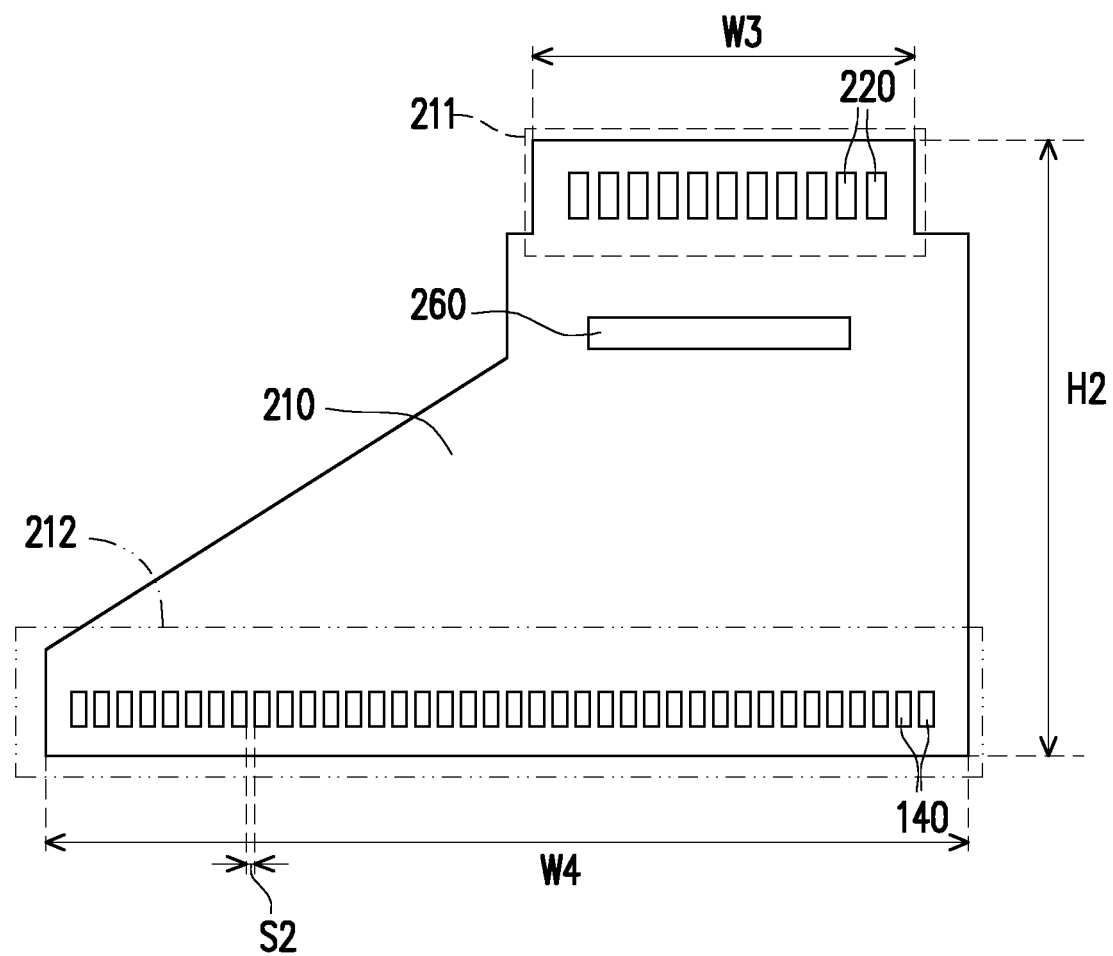
FIG. 1B is a schematic top view of a second COF according to an embodiment of the disclosure.
Figure 2:
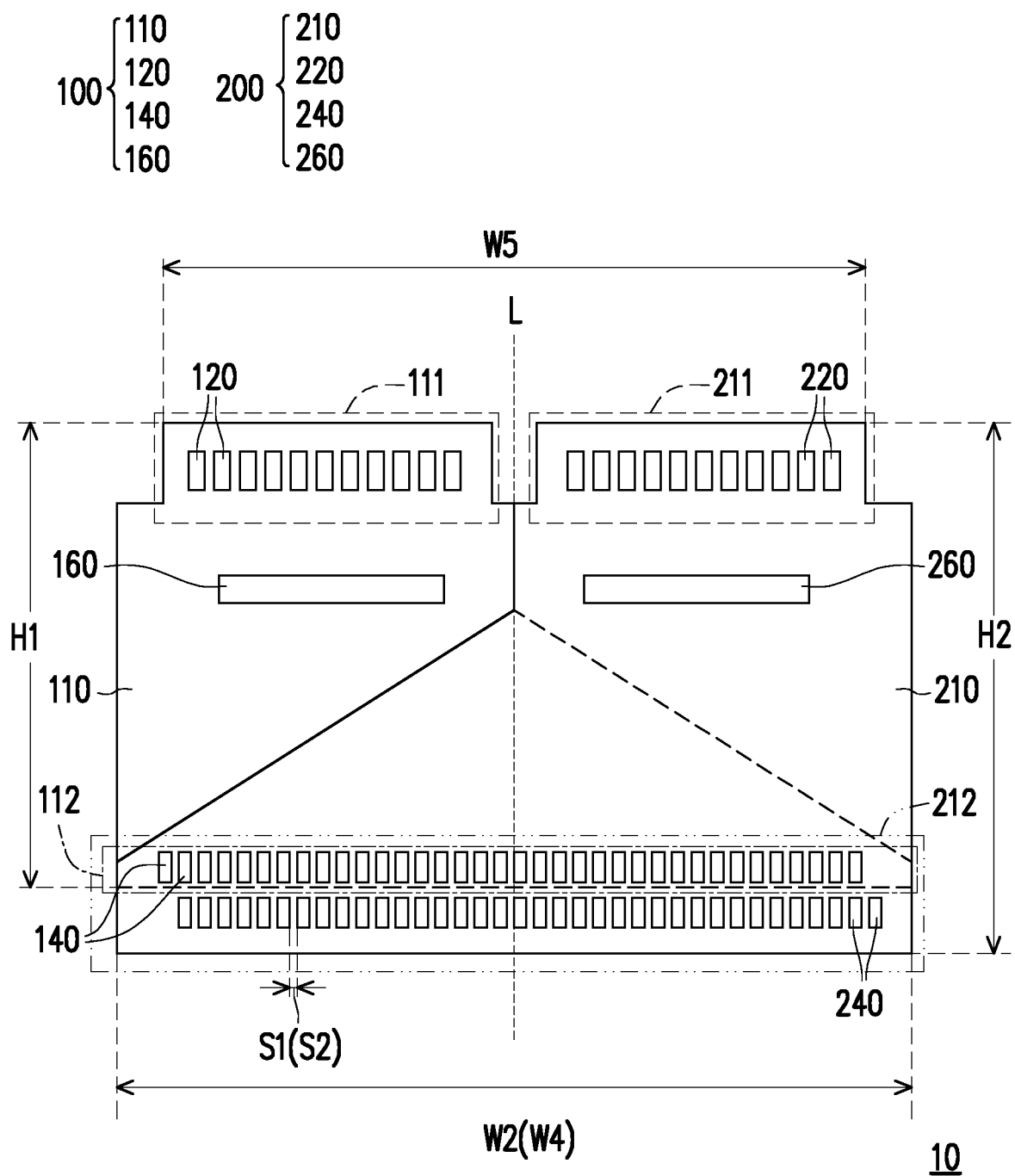
FIG. 2 is a schematic top view of a COF package structure according to an embodiment of the disclosure.

FIG. 1A is a schematic top view of a first chip-on-film (COF) according to an embodiment of the disclosure. FIG. 1B is a schematic top view of a second COF according to an embodiment of the disclosure. FIG. 2 is a schematic top view of a COF package structure according to an embodiment of the disclosure. For illustrative purposes and easy observation, FIG. 1A, FIG. 1B, and FIG. 2 schematically illustrate some of the components, and the actual number and actual size of the components are not limited to those depicted in the accompanying drawings. With reference to FIG. 1A, FIG. 1B, and FIG. 2, a chip-on-film (COF) package structure 10 includes a first COF 100 and a second COF 200.

As shown in FIG. 1A, for instance, the first COF 100 includes a first flexible substrate 110 having a first external terminal 111 and a first internal terminal 112 opposite to each other, a plurality of first outer leads 120 disposed at the first external terminal 111, a plurality of first inner leads 140 disposed at the first internal terminal 112, and a first chip 160 disposed between the first external terminal 111 and the first internal terminal 112. In the present embodiment, the first COF 100 is, for instance, a COF package. For instance, the first chip 160 may be electrically connected to the first outer leads 120 and the first inner leads 140 through applying a flip-chip bonding technique, which should however not be construed as a limitation in the disclosure. In other embodiments, the first COF 100 may also be a tape carrier package (TCP) or a chip-on-glass (COG) package. Note that the first COF 100 does not need to include the first chip 160 in the disclosure; according to other embodiments, the first COF 100 may also be a flexible substrate having no chip.

In the present embodiment, the first flexible substrate 110 is made of an organic transparent material, such as polyolefne, polyacyl, polyalcohols, polyester, rubber, a thermoplastic polymer, a thermosetting polymer, polyarylene, polymethylmethacrylate, polycarbonate, other suitable materials, derivatives thereof, or a combination thereof, which should however not be construed as a limitation in the disclosure.

In the present embodiment, the first outer leads 120 and the first inner leads 140 are disposed on the first flexible substrate 110 and respectively located at the first external terminal 111 and the first internal terminal 112 on two opposite sides of the first flexible substrate 110. The first outer leads 120 and the first inner leads 140 are often made of a metal material, which should however not be construed as a limitation in the disclosure; in other embodiments, the first outer leads 120 and the first inner leads 140 may also be made of other conductive materials, such as alloy, metal nitride, metal oxide, metal oxynitride, another appropriate material, or a stacked layer of the metal material and other conductive materials. For illustrative purposes and easy observation, note that the first outer leads 120 and the first inner leads 140 are depicted in FIG. 1A by solid lines. As a matter of fact, in the direction of the top view, the first outer leads 120 and the first inner leads 140 are located on a side of the first flexible substrate 110 facing away from a viewer (not shown) and are thus blocked from the viewer by the first flexible substrate 110.

In the present embodiment, the first inner leads 140 are arranged in one row or a single row along the first internal terminal 112. For instance, the first inner leads 140 are sequentially arranged along an extending direction of a long axis of the first internal terminal 112. The first outer leads 120 are arranged in one row or a single row along the first external terminal 111. For instance, the first outer leads 120 are sequentially arranged along an extending direction of a long axis of the first external terminal 111. The number of the first inner leads 140 is greater than the number of the first outer leads 120. A pitch S1 among the first inner leads 140 may be the same or different. The pitch S1 is from 30 μm to 60 μm, which should however not be construed as a limitation in the disclosure.

In the present embodiment, the first chip 160 is disposed on a chip bonding region (not shown) between the first external terminal 111 and the first internal terminal 112 on the first flexible substrate 110. In the present embodiment, the first COF 100 further includes a circuit layer (not shown) disposed on the first flexible substrate 110. The circuit layer is respectively in contact with the first outer leads 120, the first inner leads 140, and the first chip 160. In other words, the first chip 160 may be electrically connected to the first outer leads 120 and the first inner leads 140 through the circuit layer by applying a flip-chip bonding technique. The first chip 160 is, for instance, a driver chip or a control circuit, which should however not be construed as a limitation in the disclosure.

In the present embodiment, the first flexible substrate 110 has a first length H1. The first length H1 is defined as a length in a direction extending from the first external terminal 111 to the first internal terminal 112.

With reference to FIG. 1B, for instance, the second COF 200 includes a second flexible substrate 210 having a second external terminal 211 and a second internal terminal 212 opposite to each other, a plurality of second outer leads 220 disposed at the second external terminal 211, a plurality of second inner leads 240 disposed at the second internal terminal 212, and a second chip 260 disposed between the second external terminal 211 and the second internal terminal 212. In the present embodiment, the second COF 200 is, for instance, a COF package. For instance, the second chip 260 may be electrically connected to the second outer leads 220 and the second inner leads 240 through applying a flip-chip bonding technique, which should however not be construed as a limitation in the disclosure. In other embodiments, the second COF 200 may also be a TCP or a COG package. Note that the second COF 200 does not need to include the second chip 260 in the disclosure; according to other embodiments, the second COF 200 may also be a flexible substrate having no chip.

In the present embodiment, the second flexible substrate 210 is made of an organic transparent material, such as polyolefne, polyacyl, polyalcohols, polyester, rubber, a thermoplastic polymer, a thermosetting polymer, polyarylene, polymethylmethacrylate, polycarbonate, other suitable materials, derivatives thereof, or a combination thereof, which should however not be construed as a limitation in the disclosure.

In the present embodiment, the second outer leads 220 and the second inner leads 240 are disposed on the second flexible substrate 210 and respectively located at the second external terminal 211 and the second internal terminal 212 on two opposite sides of the second flexible substrate 210. The second outer leads 220 and the second inner leads 240 are often made of a metal material, which should however not be construed as a limitation in the disclosure; in other embodiments, the second outer leads 220 and the second inner leads 240 may also be made of other conductive materials, such as alloy, metal nitride, metal oxide, metal oxynitride, another appropriate material, or a stacked layer of the metal material and other conductive materials. For illustrative purposes and easy observation, note that the second outer leads 220 and the second inner leads 240 are depicted in FIG. 2B by solid lines. As a matter of fact, in the direction of the top view, the second outer leads 220 and the second inner leads 240 are located on a side of the second flexible substrate 210 facing away from a viewer (not shown) and are thus blocked from the viewer by the second flexible substrate 210.

In the present embodiment, the second inner leads 240 are arranged in one row or a single row along the second internal terminal 212. For instance, the second inner leads 240 are sequentially arranged along an extending direction of a long axis of the second internal terminal 212. The second outer leads 220 are arranged in one row or a single row along the second external terminal 211. For instance, the second outer leads 220 are sequentially arranged along an extending direction of a long axis of the second external terminal 211. The number of the second inner leads 240 is greater than the number of the second outer leads 220. A pitch S2 among the second inner leads 240 may be the same or different. The pitch S2 is from 30 μm to 60 μm, which should however not be construed as a limitation in the disclosure.

In the present embodiment, the second chip 260 is disposed on a chip bonding region (not shown) between the second external terminal 211 and the second internal terminal 212 on the second flexible substrate 210. In the present embodiment, the second COF 200 further includes a circuit layer (not shown) disposed on the second flexible substrate 210. The circuit layer is respectively in contact with the second outer leads 220, the second inner leads 240, and the second chip 260. In other words, the second chip 260 may be electrically connected to the second outer leads 220 and the second inner leads 240 through the circuit layer by applying a flip-chip bonding technique. The second chip 260 is, for instance, a driver chip or a control circuit, which should however not be construed as a limitation in the disclosure.

In the present embodiment, the second flexible substrate 210 has a second length H2. The second length H2 is defined as a length in a direction extending from the second external terminal 211 to the second internal terminal 212. With reference to FIG. 1A, FIG. 1B, and FIG. 2, in the present embodiment, one of the first length H1 and the second length H2 is greater than the other. For instance, the second length H2 is greater than the first length H1, which should however not be construed as a limitation in the disclosure.

With reference to FIG. 2, the COF package structure 10 depicted in FIG. 2 is a composite package structure constituted by the overlapped and bonded first and second COFs 100 and 200 (respectively depicted in FIG. 1A and FIG. 1B). For instance, the first flexible substrate 110 of the first COF 100 is partially overlapped with the second flexible substrate 210 of the second COF 200. In the present embodiment, the COF package structure 10 has a normal line L in a direction parallel to an extending direction of the first height H1 or the second height H2. The first external terminal 111 of the first COF 100 and the second external terminal 211 of the second COF 200 are respectively disposed on two opposite sides of the normal line L, and the first external terminal 111 is not overlapped with the second external terminal 211. The first internal terminal 112 and the second internal terminal 212 are at least partially overlapped. Namely, the first COF 100 is symmetrical to the second COF 200 in a direction perpendicular to the normal line L.

In the present embodiment, the first chip 160 and the second chip 260 of the COF package structure 10 are electrically isolated from each other. For instance, in a top view, an orthogonal projection of the first chip 160 on the first flexible substrate 110 is not overlapped with the second flexible substrate 210. An orthogonal projection of the second chip 260 on the second flexible substrate 210 is not overlapped with the first flexible substrate 110. As such, when the first COF 100 is overlapped with the second COF 200, the chips 160 and 260 or other circuit elements on the COFs 100 and 200 are not affected; hence, the COF package structure 10 can avoid mechanical interference and ensure good bonding yield.

It is worth noting that, according to said arrangement, note that the first outer leads 120 and the second outer leads 220 may be disposed on two opposite sides of the normal line L and arranged in one row along the same horizontal level. The first inner leads 140 and the second inner leads 240 are respectively located in the overlapped first internal terminal 112 and second internal terminal 212, and the first inner leads 140 and the second inner leads 240 at the overlapping portions of the first internal terminal 112 and the second internal terminal 212 are arranged in rows. For the external terminals 111 and 211, which are not required to have a large number of leads, the first outer leads 120 and the second outer leads 220 may be simply arranged in one row. Besides, the COF package structure 10 may provide a proper pitch among the first outer leads 120 or the second outer leads 220, so as to ensure good bonding yield and electrical property in the subsequent bonding process, e.g., a tape automated bonding (TAB) process.

For the internal terminals 112 and 212, which are required to have a large number of leads, the first inner leads 140 and the second internal leads 240 may be simply respectively arranged in one row at the first internal terminal 112 and the second internal terminal 212. The first COF 100 is then overlapped with the second COF 200, so that the first internal terminal 112 is overlapped with the second internal terminal 212. According to said arrangement, since the second length H2 may be greater than the first length H1, the first inner leads 140 and the second inner leads 240 at the overlapping portions of the first internal terminal 112 and the second internal terminal 212 may be aligned and arranged in two or more rows in a direction parallel to the extending direction of the lengths H1 and H2, which should however not be construed as a limitation in the disclosure. That is, in the COF package structure 10, two COFs with one row of inner leads may be simply overlapped and bonded, so as to form the COF package structure 10 with the inner leads arranged in multiple rows. Thereby, the COF package structure 10 may be equipped with multiple rows of inner leads 140 and 240 at the significantly reduced cost, so as to increase the number of the inner leads 140 and 240 without reducing the pitches S1 and S2 among the leads. Compared to the conventional COF package equipped with a great number of leads, the COF package structure 10 provided in the present embodiment may have the same number of leads, but the pitches S1 and S2 among the leads can be expanded; as such, good bonding yield and electrical quality can be guaranteed in the subsequent TAB process.

In the previous embodiment, the first inner leads 140 and the second inner leads 240 are aligned, which should however not be construed as a limitation in the disclosure. In other embodiments, the first inner leads 140 and the second inner leads 240 may also be alternately arranged in a direction perpendicular to the extending direction of the lengths H1 and H2, which should however not be construed as a limitation in the disclosure. Besides, according to the previous embodiment, the width of the pitch S1 is the same as the width of the pitch S2, which should however not be construed as a limitation in the disclosure. In other embodiments, the width of the pitch S1 may also be different from the width of the pitch S2.

With reference to FIG. 1A, FIG. 1B, and FIG. 2, in the present embodiment, a width W2 of the first internal terminal 112 is greater than a width W1 of the first external terminal 111, and a width W4 of the second internal terminal 212 is greater than a width W3 of the second external terminal 211. For instance, the first COF 100 and the second COF 200 are respectively of an irregular shape, which should however not be construed as a limitation in the disclosure.

In the present embodiment, the irregular first and second COFs 100 and 200 are overlapped and bonded in a complementary manner to form the COF package structure 10. For instance, the first external terminal 111 is not overlapped with the second external terminal 212, but the first internal terminal 112 is overlapped with the second internal terminal 212. Thereby, the first external terminal 111 may serve as an external terminal of the COF package structure 10 on the left side of the normal line L, and the second external terminal 211 may serve as an external terminal of the COF package structure 10 on the right side of the normal line L. According to said arrangement, the sum W1+W3 of the width W1 of the first external terminal 111 and the width W3 of the second external terminal 211 is a width W5, and the width W5 is shorter than the width W2 of the internal terminal 112 or the width W4 of the internal terminal 212. Specifically, the width W2 and the width W4 are the same, which should however not be construed as a limitation in the disclosure. Thus, the widths of the external terminals 111 and 211 having a small number of leads in the COF package structure 10 may be reduced, and the size of the COF package structure 10 is adjusted to comply with the requirement of production apparatus in the subsequent bonding process as well as improve productivity and electrical quality.

In brief, in the COF package structure 10, the first and second COFs 100 and 200 of an irregular shape and with one row of inner leads may be simply overlapped and bonded, so as to form the COF package structure 10 with the inner leads arranged in multiple rows. Thereby, the COF package structure 10 may be equipped with multiple rows of inner leads 140 and 240 at the significantly reduced manufacturing cost, so as to increase the number of the inner leads 140 and 240 without reducing the pitches S1 and S2 among the inner leads 140 and 240. As a result, the COF package structure 10 provided in the present embodiment may have the increased number of inner leads 140 and 240 and expand the pitches S1 and S2, so as to guarantee good bonding yield and electrical quality in the subsequent bonding process. Besides, the size of the COF package structure 10 may be further adjusted to increase or to decrease in order to comply with the requirement of the production apparatus in the subsequent bonding process as well as improve productivity and electrical quality.

It should be noted that the reference numerals and a part of the contents in the previous embodiment are used in the following embodiments, in which identical reference numerals indicate identical or similar components, and repeated description of the same technical contents is omitted.

Figure 3:
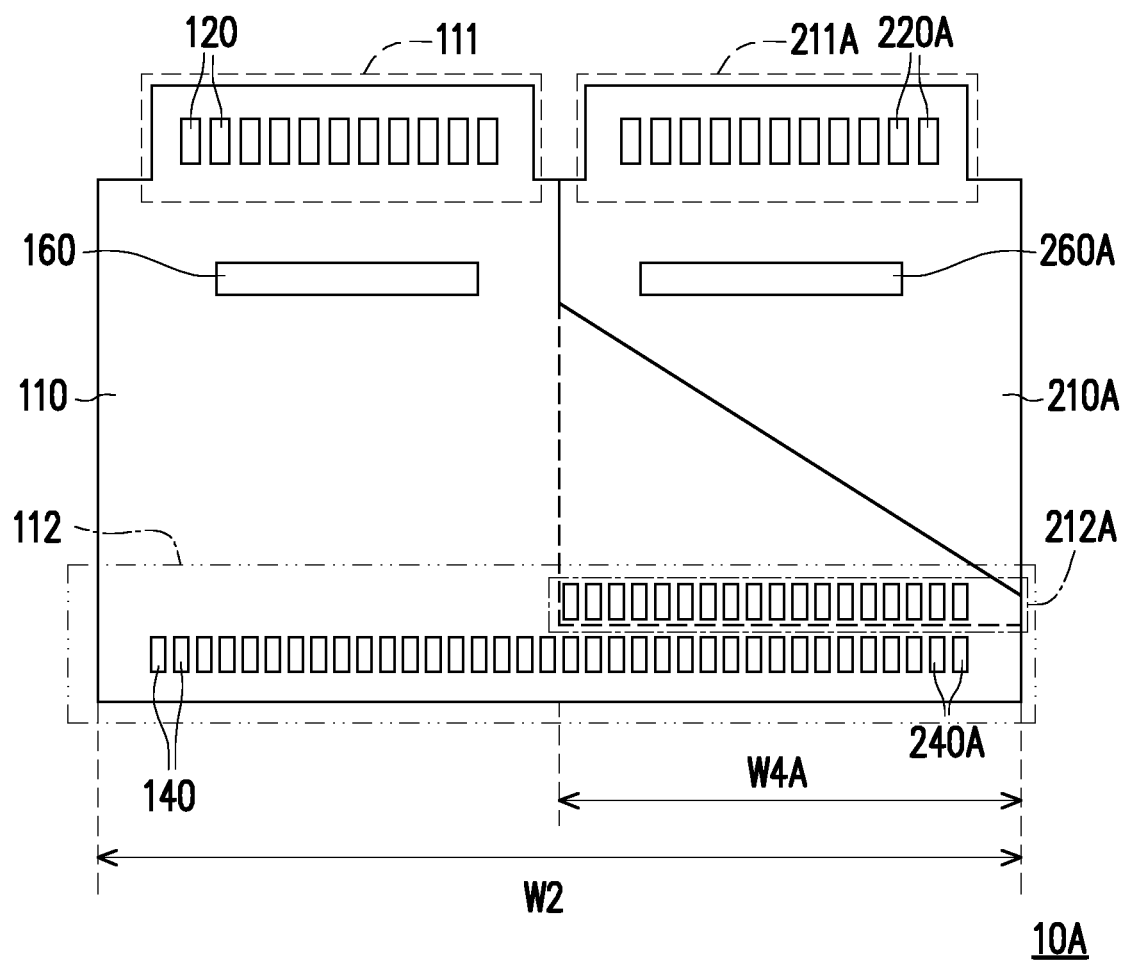
FIG. 3 is a schematic top view of a COF package structure according to another embodiment of the disclosure.

FIG. 3 is a schematic top view of a COF package structure according to another embodiment of the disclosure. With reference to FIG. 2 and FIG. 3, the COF package structure 10A provided in the present embodiment is similar to the COF package structure 10 depicted in FIG. 2, while some differences therebetween lie in that the width of one of the first internal terminal 112 and a second internal terminal 212A is greater than the width of the other. For instance, in the present embodiment, the width W2 of the first internal terminal 112 of the first COF 100 is greater than a width W4A of the second internal terminal 212A of a second COF 200A, which should however not be construed as a limitation in the disclosure.

Additionally, one of the first COF 100 and the second COF 200A is of an irregular shape. For instance, the first COF 100 is of an irregular shape, and the outline of the second COF 200A may be substantially rectangular. In the present embodiment, the second outer leads 220A are arranged at the second external terminal 211A, the first inner leads 140 and the second inner leads 240A at the overlapping portions of the first internal terminal 112 and the second internal terminal 212A are arranged in multiple rows, and a second chip 260A is disposed on a second flexible substrate 210A and electrically isolated from the first chip 160. Thereby, compared to the COFs in the COF package structure 10, the first COF 100 and the second COF 200A of the COF package structure 10A may be arranged in an asymmetric manner and can still achieve technical effects similar to those accomplished in the previous embodiment.

Figure 4:
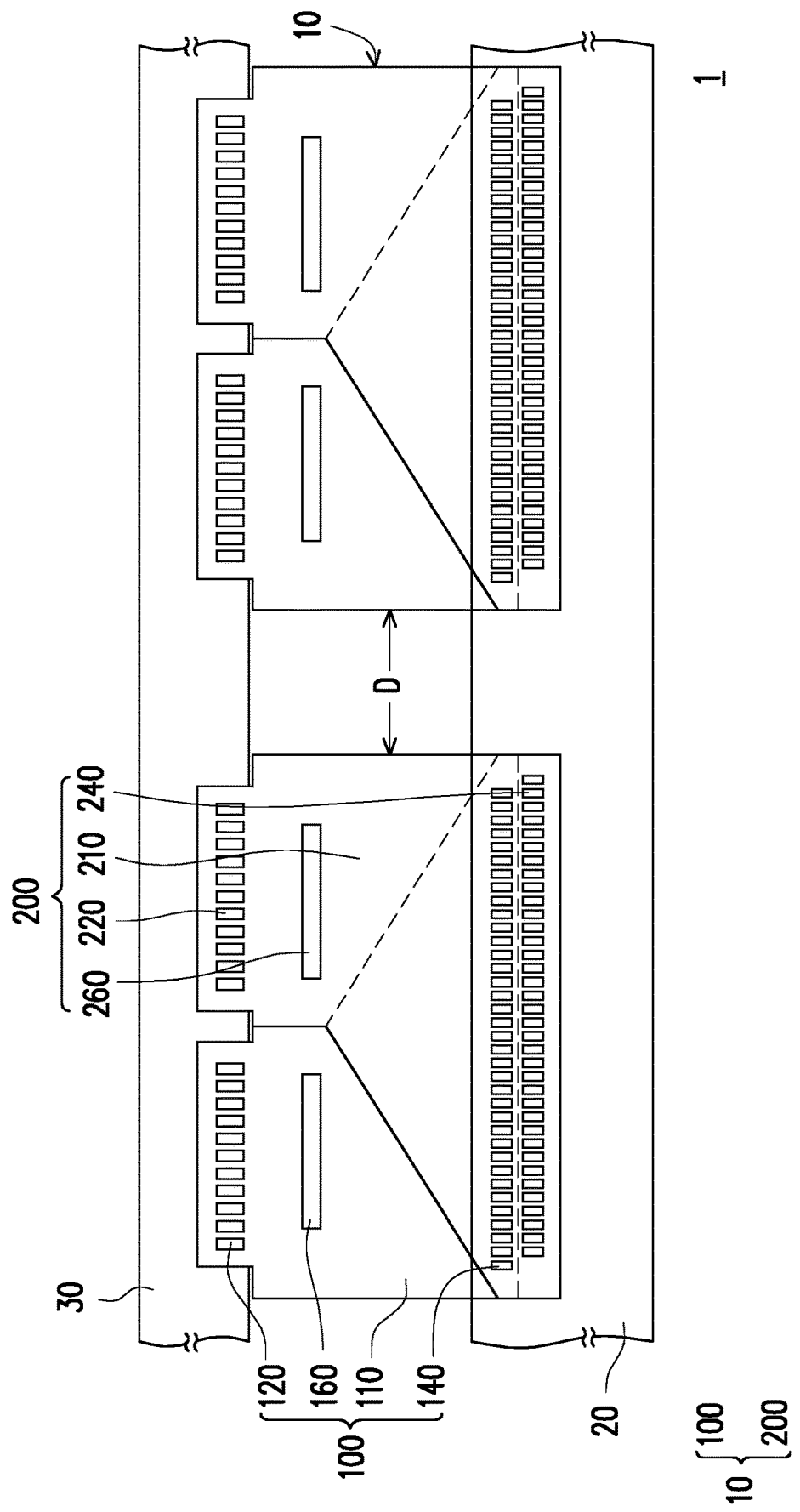
FIG. 4 is a schematic top enlarged view of a portion of a display device according to an embodiment of the disclosure.

FIG. 4 is a schematic top enlarged view of a portion of a display device according to an embodiment of the disclosure. With reference to FIG. 2 and FIG. 4, in the present embodiment, a display device 1 includes a display panel 20, a circuit board 30, and a plurality of the aforementioned COF package structures 10. The COF package structure 10 electrically connects the circuit board 30 to the display panel 20, so that the driving signals of the circuit board 30 can be transmitted to the display panel 20. In the present embodiment, the display panel 20 may be a liquid crystal display panel, an organic light emitting diode (LED) display panel, a micro-LED display panel, a mini-LED display panel, a quantum-dot LED display panel, a plasma display panel, an electrophoretic display panel, or any other appropriate display panel, which should however not be construed as a limitation in the disclosure. Said types of display panels are known to people skilled in the pertinent art and therefore will not be further explained hereinafter. The circuit board 30 may be a flexible printed circuit board, which should not be construed as a limitation in the disclosure.

In the present embodiment, the display panel 20 is electrically connected to the first inner leads 140 and the second inner leads 240 of the COF package structures 10. The circuit board 30 is electrically connected to the first outer leads 120 and the second outer leads 220 of the COF package structures 10. Thereby, the driving signals of the circuit board 30 may be transmitted to the first chips 160 and the second chips 260 through the outer leads 120 and 220 and then transmitted to the inner leads 140 and 240, so as to drive the display panel 20.

It is worth noting that, the resolution of the conventional display panel is proportional to the number of required COF packages and is also proportional to the number of inner leads on the COF packages. Hence, the UHD display panel required a significant number of COF packages, so as to transmit the driving signals to the display panel. In the present embodiment, two COFs 100 and 200 in the COF package structure 10 can be overlapped; hence, the inner leads 140, 240 may be arranged in multiple rows at the overlapped internal terminals 112 and 212 (as illustrated in FIG. 2), so as to increase the number of inner leads 140 and 240. According to said arrangement, the number of the COF package structures 10 required by the display device 1 may be reduced without reducing the number of the inner leads 140 and 240, and the requirement of the UHD display panel 20 for the number of the inner leads 140 and 240 can be satisfied.

In brief, since the number of the inner leads 140 and 240 of the COF package structures 10 can be increased, the number of the COF package structures 10 required by the display device 1 can be decreased, so as to increase the distance D between the adjacent COF package structures 10. For instance, the distance D between any two adjacent COF package structures 10 is from 0.1 mm to 4 mm. In comparison with the conventional UHD display panel, the distance between the COF package structures 10 of the display device 1 can be increased. As such, during a bonding process in which the TAB technique is applied to bond the COF package structures 10 to the display panel 20 and the circuit board 30, the distance D between the adjacent COF package structures 10 can comply with the requirement of the outer lead bonding (OLB) production apparatus, so as to ensure good bonding yield and productivity. Moreover, the distance D between the adjacent COF package structures 10 can be further adjusted to increase or decrease, so as to adjust the number of the COF package structures 10, increase the resolution and image quality, and improve the display quality of the display device 1.

To sum up, in the COF package structure and the display panel provided in one embodiment of the disclosure, the first and second COFs each respectively with one row of inner leads may be simply overlapped and bonded, so as to form the COF package structure with the inner leads arranged in multiple rows. Thereby, the resultant COF package structure may be equipped with multiple rows of inner leads at the significantly reduced manufacturing cost, so as to increase the number of the inner leads without reducing the pitches among the inner leads and ensure good bonding yield as well as electrical quality. Additionally, since the number of the inner leads can be increased, the number of the COF package structures required by the display device can be decreased, so as to increase the distance between the adjacent COF package structures. As such, during a bonding process, the distance between the adjacent COF package structures can comply with the requirement of the production apparatus for outer lead bonding, so as to ensure good bonding yield and productivity. Moreover, the number of the COF package structures can be further adjusted, so as to improve the resolution and image quality as well as improve the display quality of the display device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A chip-on-film package structure, comprising:
   a first chip-on-film, comprising:
      a first flexible substrate, having a first external terminal and a first internal terminal opposite to each other;
      a plurality of first outer leads disposed at the first external terminal;
      a plurality of first inner leads disposed at the first internal terminal; and
      a first chip disposed between the first external terminal and the first internal terminal; and
   a second chip-on-film, comprising:
      a second flexible substrate, having a second external terminal and a second internal terminal opposite to each other;
      a plurality of second outer leads disposed at the second external terminal;
      a plurality of second inner leads disposed at the second internal terminal; and
      a second chip disposed between the second external terminal and the second internal terminal,
   wherein the first chip-on-film is partially overlapped with the second chip-on-film,
   wherein the first external terminal and the second external terminal are disposed at two opposite sides of a normal line, and the first internal terminal and the second internal terminal are at least partially overlapped.

2. The chip-on-film package structure as recited in claim 1, wherein the first external terminal is not overlapped with the second external terminal.

3. The chip-on-film package structure as recited in claim 2, wherein the first outer leads and the second outer leads are disposed on two opposite sides of the normal line and are arranged in one row along the first external terminal and the second external terminal, respectively.

4. A display device, comprising:
   a display panel;
   a circuit board; and
   a plurality of the chip-on-film package structures as recited in claim 3,
   wherein the display panel is electrically connected to the first inner leads and the second inner leads of the chip-on-film package structures, and the circuit board is electrically connected to the first outer leads and the second outer leads of the chip-on-film package structures,
   wherein a distance is between any two adjacent chip-on-film package structures, and the distance is from 0.1 mm to 4 mm.

5. A display device, comprising:
   a display panel;
   a circuit board; and
   a plurality of the chip-on-film package structures as recited in claim 2,
   wherein the display panel is electrically connected to the first inner leads and the second inner leads of the chip-on-film package structures, and the circuit board is electrically connected to the first outer leads and the second outer leads of the chip-on-film package structures, wherein a distance is between any two adjacent chip-on-film package structures, and the distance is from 0.1 mm to 4 mm.

6. The chip-on-film package structure as recited in claim 1, wherein a width of the first internal terminal is greater than a width of the first external terminal, and a width of the second internal terminal is greater than a width of the second external terminal.

7. The chip-on-film package structure as recited in claim 1, wherein the plurality of first inner leads and the plurality of second inner leads are arranged in one row along the first internal terminal and the second internal terminal, respectively, and the first inner leads and the second inner leads at overlapping portions of the first internal terminal and the second internal terminal are arranged in a plurality of rows.

8. A display device, comprising:
a display panel;
a circuit board; and
a plurality of the chip-on-film package structures as recited in claim 7,
wherein the display panel is electrically connected to the first inner leads and the second inner leads of the chip-on-film package structures, and the circuit board is electrically connected to the first outer leads and the second outer leads of the chip-on-film package structures,
wherein a distance is between any two adjacent chip-on-film package structures, and the distance is from 0.1 mm to 4 mm.

9. The chip-on-film package structure as recited in claim 1, wherein the first chip and the second chip are electrically isolated from each other, an orthogonal projection of the first chip on the first flexible substrate is not overlapped with the second flexible substrate, and an orthogonal projection of the second chip on the second flexible substrate is not overlapped with the first flexible substrate.

10. A display device, comprising:
a display panel;
a circuit board; and
a plurality of the chip-on-film package structures as recited in claim 9,
wherein the display panel is electrically connected to the first inner leads and the second inner leads of the chip-on-film package structures, and the circuit board is electrically connected to the first outer leads and the second outer leads of the chip-on-film package structures,
wherein a distance is between any two adjacent chip-on-film package structures, and the distance is from 0.1 mm to 4 mm.

11. The chip-on-film package structure as recited in claim 1, wherein the number of the first inner leads is greater than the number of the first outer leads, and the number of the second inner leads is greater than the number of the second outer leads, wherein a pitch between the first inner leads or a pitch between the second inner leads is from 30 µm to 60 µm.

12. A display device, comprising:
a display panel;
a circuit board; and
a plurality of the chip-on-film package structures as recited in claim 11,
wherein the display panel is electrically connected to the first inner leads and the second inner leads of the chip-on-film package structures, and the circuit board is electrically connected to the first outer leads and the second outer leads of the chip-on-film package structures,
wherein a distance is between any two adjacent chip-on-film package structures, and the distance is from 0.1 mm to 4 mm.

13. The chip-on-film package structure as recited in claim 1, wherein the first flexible substrate has a first length, the second flexible substrate has a second length, and one of the first length and the second length is greater than the other one of the first length and the second length.

14. A display device, comprising:
a display panel;
a circuit board; and
a plurality of the chip-on-film package structures as recited in claim 13,
wherein the display panel is electrically connected to the first inner leads and the second inner leads of the chip-on-film package structures, and the circuit board is electrically connected to the first outer leads and the second outer leads of the chip-on-film package structures,
wherein a distance is between any two adjacent chip-on-film package structures, and the distance is from 0.1 mm to 4 mm.

15. A display device, comprising:
a display panel;
a circuit board; and
a plurality of the chip-on-film package structures as recited in claim 6,
wherein the display panel is electrically connected to the first inner leads and the second inner leads of the chip-on-film package structures, and the circuit board is electrically connected to the first outer leads and the second outer leads of the chip-on-film package structures,
wherein a distance is between any two adjacent chip-on-film package structures, and the distance is from 0.1 mm to 4 mm.

16. The chip-on-film package structure as recited in claim 6, wherein one of the width of the first internal terminal and the width of the second internal terminal is greater than the other one of the width of the first internal terminal and the width of the second internal terminal.

17. A display device, comprising:
a display panel;
a circuit board; and
a plurality of the chip-on-film package structures as recited in claim 16,
wherein the display panel is electrically connected to the first inner leads and the second inner leads of the chip-on-film package structures, and the circuit board is electrically connected to the first outer leads and the second outer leads of the chip-on-film package structures,
wherein a distance is between any two adjacent chip-on-film package structures, and the distance is from 0.1 mm to 4 mm.

18. The chip-on-film package structure as recited in claim 1, wherein one of the first chip-on-film and the second chip-on-film is of an irregular shape.

19. A display device, comprising:
a display panel;
a circuit board; and
a plurality of the chip-on-film package structures as recited in claim 18, wherein the display panel is electrically connected to the first inner leads and the second inner leads of the chip-on-film package structures, and the circuit board is electrically connected to the first outer leads and the second outer leads of the chip-on-film package structures, wherein a distance is between any two adjacent chip-on-film package structures, and the distance is from 0.1 mm to 4 mm.

20. A display device, comprising:

a display panel;

a circuit board; and a plurality of the chip-on-film package structures as recited in claim 1, wherein the display panel is electrically connected to the first inner leads and the second inner leads of the chip-on-film package structures, and the circuit board is electrically connected to the first outer leads and the second outer leads of the chip-on-film package structures, wherein a distance is between any two adjacent chip-on-film package structures, and the distance is from 0.1 mm to 4 mm.

* * * * *